US009391447B2

(12) United States Patent
Fledell et al.

(10) Patent No.: US 9,391,447 B2
(45) Date of Patent: Jul. 12, 2016

(54) INTERPOSER TO REGULATE CURRENT FOR WAFER TEST TOOLING

(75) Inventors: Evan M. Fledell, Beaverton, OR (US); Paul B. Fischer, Portland, OR (US); Roy E. Swart, Hillsboro, OR (US); Timothy J. Maloney, Palo Alto, CA (US); Jack D. Pippin, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 13/976,970

(22) PCT Filed: Mar. 6, 2012

(86) PCT No.: PCT/US2012/027919
§ 371 (c)(1),
(2), (4) Date: Jun. 27, 2013

(87) PCT Pub. No.: WO2013/133809
PCT Pub. Date: Sep. 12, 2013

(65) Prior Publication Data

US 2014/0029150 A1 Jan. 30, 2014

(51) Int. Cl.
*H02H 9/08* (2006.01)
*H02H 9/02* (2006.01)
*G01R 1/36* (2006.01)
*G01R 31/28* (2006.01)
*G01R 1/073* (2006.01)

(52) U.S. Cl.
CPC .. *H02H 9/02* (2013.01); *G01R 1/36* (2013.01); *G01R 31/2889* (2013.01); *G01R 1/07385* (2013.01)

(58) Field of Classification Search
CPC ......... H02H 9/02; G01R 1/36; G01R 31/2889
See application file for complete search history.

(56) References Cited

U.S. PATENT DOCUMENTS

| | | | | |
|---|---|---|---|---|
| 4,686,627 | A * | 8/1987 | Donovan et al. | 702/119 |
| 7,193,401 | B1 * | 3/2007 | Hasegawa | 323/283 |
| 2005/0237073 | A1 | 10/2005 | Charles et al. | |
| 2007/0229141 | A1 * | 10/2007 | Grover | 327/427 |
| 2008/0290882 | A1 | 11/2008 | Rogers et al. | |
| 2009/0085590 | A1 * | 4/2009 | Berry et al. | 324/754 |
| 2010/0039739 | A1 | 2/2010 | Barbara et al. | |
| 2011/0109337 | A1 | 5/2011 | Komoto et al. | |
| 2013/0069683 | A1 * | 3/2013 | Kuo et al. | 324/755.03 |

OTHER PUBLICATIONS

PCT Search Report, PCT/US2012/027919, Intel Corporation, Nov. 28, 2012, 11 pages.

* cited by examiner

*Primary Examiner* — Thienvu Tran
*Assistant Examiner* — Tien Mai
(74) *Attorney, Agent, or Firm* — Blakely, Sokoloff, Taylor & Zafman LLP

(57) ABSTRACT

An interposer is described to regulate the current in wafer test tooling. In one example, the interposer includes a first connection pad to couple to automated test equipment and a second connection pad to couple to a device under test. The interposer further includes an overcurrent limit circuit to connect the first and second connection pads and to disconnect the first and second connection pads when the current between the first and second connection pads is over a predetermined amount.

20 Claims, 5 Drawing Sheets

INTERPOSER TO REGULATE CURRENT FOR WAFER TEST TOOLING

CROSS-REFERENCE TO RELATED APPLICATION

This patent application is a U.S. National Phase Application under 35 U.S.C. §371 of International Application No. PCT/US2012/027919, filed Mar. 6, 2012, entitled "AN INTERPOSER TO REGULATE CURRENT FOR WAFER TEST TOOLING".

BACKGROUND

After a semiconductor or silicon wafer is produced it is processed through a variety of tests to ensure that it works as intended. One of the test tooling units places contacts onto the connection bumps of each die to test bump integrity and also to test for shorts and grounds. Currents are applied to each connection bump of each die. Among the tests are measurements of currents that occur from applied voltages and currents. If there is a failure at one or more of the connection bumps of a die during a test, however, there may be an over current condition at the connection bump. This may propagate through the test tool and damage the test tool. Wafer test tooling, for example, a Sort Interface Unit (SIU) has no ability to protect itself from individual wafer bump or probe level failures while testing silicon wafers. As a result, the service life of the test tooling is reduced.

Damage to the tool can be mitigated by modifying the test program that controls the automated test equipment (ATE testers). However, this approach does not correct for the failure of individual probes and is too slow to protect against overcurrent power supply clamping events. Damage can also be mitigated by increasing the current carrying capabilities of the wafer probes. However, the current carrying ability of a probe is determined by the physical dimensions of the probe so that as the connection bumps become closer together with future chip generations, the size of the probes must also be reduced. Larger, higher current probes cannot be used when the connection points are very close together. The effects of over current can also be mitigated using modification of the printed circuit boards of the test tooling. However such circuitry cannot address failures at a particular probe because the connections to multiple probes are combined together at the printed circuit board. In addition, due to the long leads from each probe to the printed circuit board the response time is too slow for overcurrent events.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

A current limiting circuit block architecture can be implemented into a silicon based space transformer in a wafer or die test tool. The space transformer serves to protect the wafer test tooling from over-current events induced by performing functional tests on connection points of a die.

Figure 1:
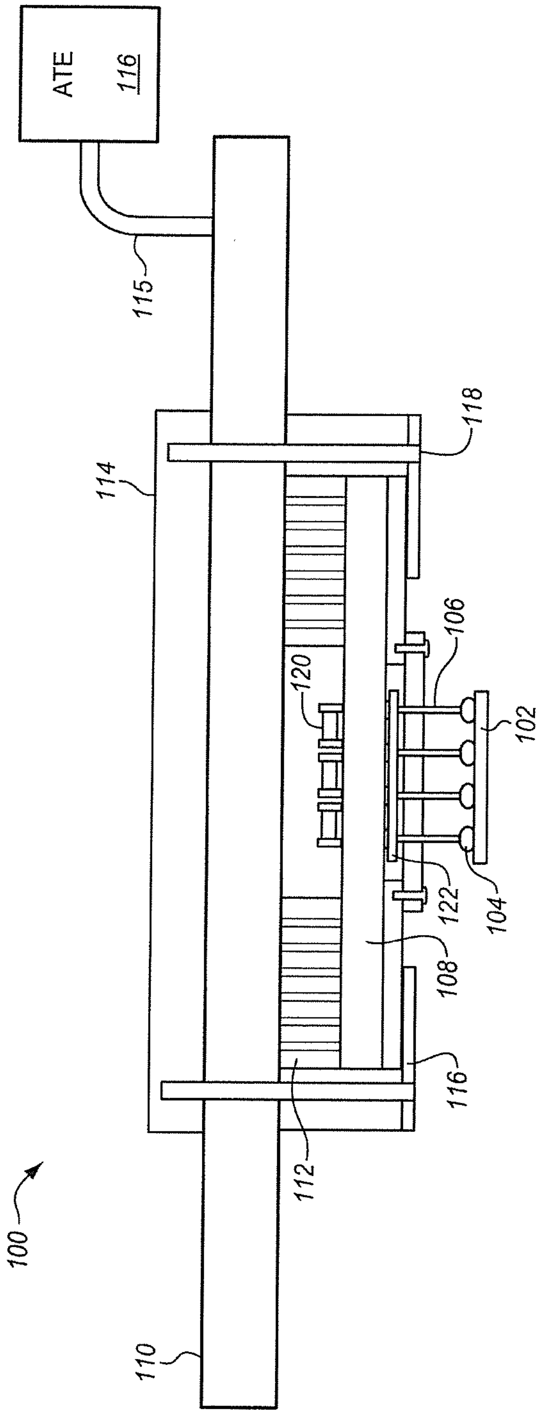
FIG. 1 is cross-sectional diagram or a wafer test tool having a current regulation interposer according to an embodiment of the invention.

A silicon substrate may be added to test tooling that contains active circuitry for probe over current protection. The substrate may also have through silicon vias (TSV) for system interconnect. FIG. 1 shows how such a substrate may be used in the context of a portion 100 of a typical SIU (Sort Interface Unit). The DUT (device under test) 102 is a die that may or may not be part of a larger wafer. In some systems the wafer is placed on a turntable and the wafer is rotated to place each die under a test head. One or more dies may be tested at the same time. The die may be semiconductor, micromechanical, optical or any other type of die. The die is shown as having set of connection balls 104 that allow for connection with the test equipment and at least some of which will allow for connection to other circuitry after the die is packaged.

The test system 100 has a set of wafer probes to make contact with the connection balls of the die. The wafer probes apply currents and voltages to the connection balls and measure the results. The probes are susceptible to damage if there is a flaw in the die that allows the current or voltage to exceed the capacity of the probe. The probes are made of various metal alloys and can be thought of as a very thin wire. Physical size limitations exist due to the high density or fine pitch of the die connection pads and balls. The high density/fine pitch means that the balls are very close together, so that the amount of physical space available for each probe is limited.

The test system also has a PCB (printed circuit board) 110 that allows for probes to be coupled to cables or circuits or other devices. The PCB is coupled through a cable 115 to an electronic automated tester 116. The automated tester generates electrical signals in an appropriate sequence and with appropriate values. These are sent through the cable 115 to the PCB and from the PCB to the probes. Sensed signals received through the probes and other sensors (not shown) travel in the opposite direction.

The probes 106 are connected to the PCB 110 through a ceramic, organic, or ceramic organic package 108, also referred to as a space transformer that is used to translate the system printed circuit hoard electrical connection pitch to wafer bump pitch. From the space transformer 108, the signals are coupled through a space transform to PCB interposer 112.

For structural purposes, FIG. 1 also shows top side stiffening hardware 114 to carry the PCB interposers and probes as well as bottom side hardware 116 coupled together with clamping screws 118 in four or more locations. Further structural and convenience hardware (not shown) may be included, depending on the particular application for the test system. There may also be additional electrical and electronic components. A set of back side capacitors 120 is shown as one example. The back side capacitors are attached to the back side of the space transformer in an open area of the back side of the transformer. The capacitors serve to avoid static discharge, power supply decoupling, and other problems. Other discrete or integrated components may be used instead of or in addition to the capacitors in the same or in different positions.

While the wafer contact probes 106 are typically attached directly to the space transformer 108. In the example of FIG. 1, an additional interposer 122 is placed between the probe contacts and the space transformer. The silicon interposer is equipped with active circuits to protect the contract probes from an overcurrent and to isolate the rest of the system from the overcurrent. In one example, the interposer has current regulation circuitry. Electrical redistribution layers, analog MOSFETs (Metal Oxide Semiconductor Field Effect Transistor), and control logic may be included for current regulation circuit operation. The layer may also include communication blocks for external control, and TSVs (Through Silicon Vias) for interconnection to the rest of the system platform.

In one example, using this current regulation interposer 122, when a defective die requests a current load larger than the capability of the individual probe, the regulation circuit will detect this event. Using the active circuits, the circuit may then limit the current draw to a predefined level suitable for reliable system operation. At the same time communications may be sent to the ATE (Automated Test Equipment) to identify that an event has occurred. Additional and different functions may be provided by additional active and passive circuitry in the current regulation interposer.

The position of the interposer greatly improves its ability to protect the test equipment. An overcurrent condition is detected almost immediately because the interposer is directly connected to each probe. The condition can also be isolated to the affected probes without affecting other probes. In addition, if the current is between two probes, then the connection can be broken to stop the current flow. In the space transformer and the PCB, the connections for some of the probes are connected together. This is particularly true for power connections. As an example, typically many of the connection balls on the die are for power supply to the die. Connecting all of the corresponding probe contacts to a single power source greatly simplifies the test equipment. However, because all of the probes are coupled together, many probes may be damaged by an overcurrent in the power supply connections. At the current regulation interposer, however, each contact probe is independently coupled to the interposer. As shown the interposer 122 also has a grid of connection to the space transformer 108. These connections may be designed to connect to the space transformer in exactly the same position that the contact probes would otherwise connect to the space transformer.

Figure 2:
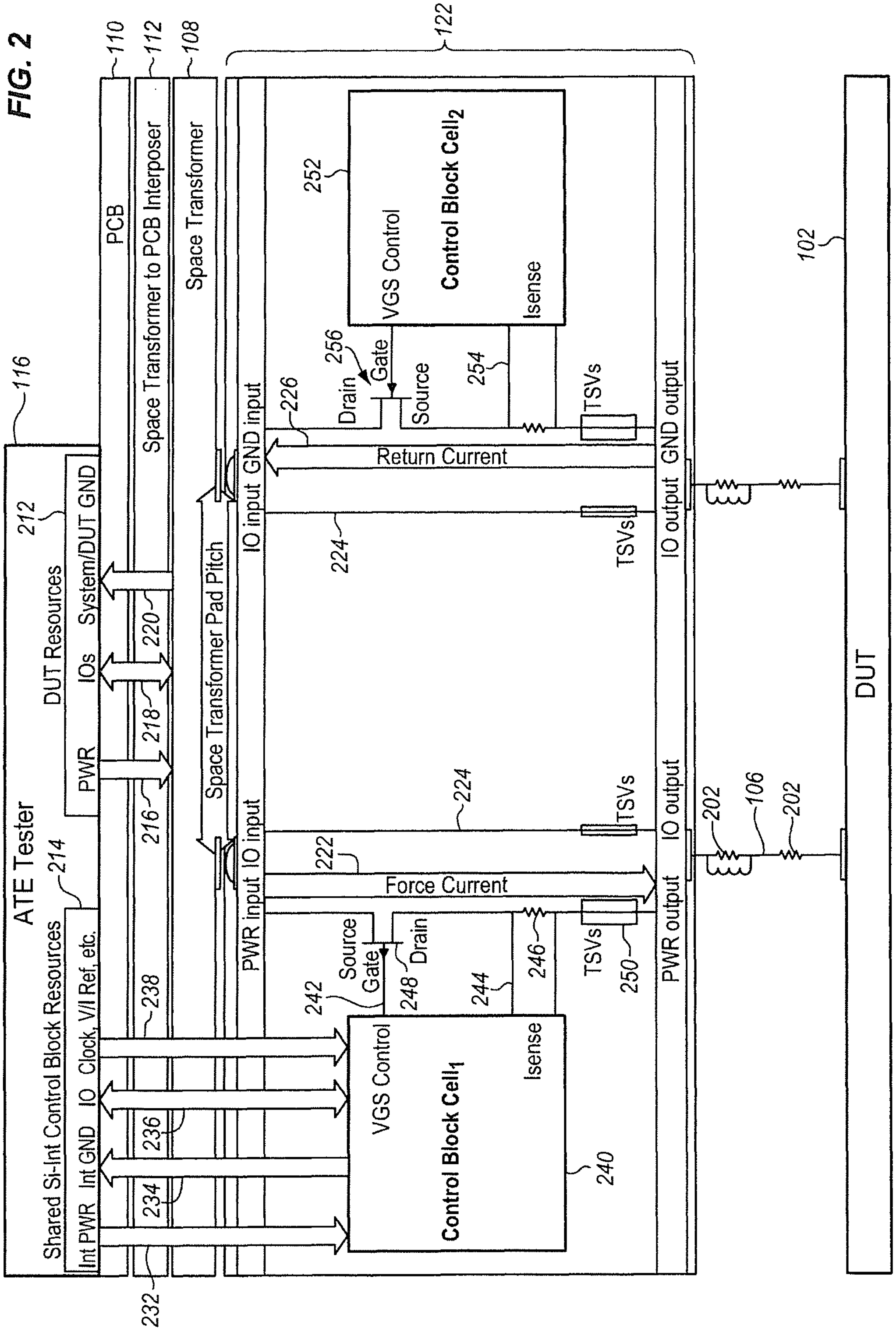
FIG. 2 is a functional block diagram of an example of a wafer test tool having a current regulation interposer according to an embodiment of the invention.

FIG. 2 is a diagram of simplified circuit elements of a current regulation interposer 122 in more detail coupled to the other components of the tester 100 of FIG. 1 for context. The DUT 102 is coupled through its connection pads to probes 106. The probes are represented as a having resistance 202 at the connection to the DUT and also having an inductance-resistance (LR) loop as an inherent property of the conductive metal probe. The probes are coupled to the silicon interposer 122 which is coupled to the space transformer 108 which is coupled to the PCB interposer 112 which is coupled to the PCB 110 which is coupled to the ATE tester 116. The connections are shown as direct connections in this diagram for purposes of explanation. However, the specific nature of the connection will depend upon the nature of the physical construction of the components and may be by wire, cable, direct solder or ball connection or by a variety of other connection and coupling technologies.

The ATE tester 116 has two connection sections as shown. More sections may also be used to support additional functions. One section 212 couples to the DUT 102 to drive the DUT through its various modes. It has a power supply 216, a return ground 220, and an I/O (Input/Output) data connection section 218 which is typically bidirectional to drive signals onto the DUT and also to receive signals from the DUT. The power is supplied through the current limiting interposer 122 through a power line 222. The power line is coupled to an appropriate probe 106 to supply power to the DUT during test. The ground 220 is similarly coupled through the interposer using a ground line 226 to an appropriate probe 106. The power and ground lines are coupled to the probes using conductive lines through the silicon of the interposer. This allows additional current regulation circuitry to be connected to the lines. The I/O signals on the contrary are coupled through TSVs 224 directly to appropriate probes. This isolates the I/O signals from any effects of the silicon interposer 122 and its circuitry. As indicated in the diagram of FIG. 2, the space transformer 108 changes the positions of the connections between the PCB and the probes. However the current regulation interposer may be designed so that there is no change in pitch or position of the connectors.

The ATE tester has a second connection section 214 for the current regulation circuitry of the current regulation interposer. In this example, the ATE drives and controls the current regulation interposer. A power line 232 and a ground line 234 provide power to control a control block cell 240 of the interposer. An I/O line 236 allows data to be transferred to and from the control block cell and a clock line 238 allows synchronous data and test signals to be communicated between the tester and the control block cell. The control block cell has a current sensor 244 that detects the current on the power line to the DUT across a resistor 246. The control block cell also has a gate/source voltage controller 242 coupled to a MOSFET 248. The MOSFET has its source and drain coupled across the power line to the DUT. As shown in the diagram some or part of the lines through the interposer may be routed through TSVs 250 for isolation from the other circuitry and to reduce line impedance and capacitance.

Additional control block cells 252 may be used for ground signals and for other power signals. Each control block cell 252 includes a voltage controller 252 coupled to a respective MOSFET 256 and a current detector 254. Each control block cell is also coupled to the ATE tester. While power supply connections 232, 234, may be shared the I/O 236, and clock signals 238 may each be dedicated to a specific control block cell.

In this example, silicon wafer processing techniques may be used to pattern the MOSFET device 248 of the interposer 122. The MOSFET may have electrical specifications that allow the source to drain current, whether p-FET or n-FET, to flow in the linear region of the ID (Drain Current) vs. VDS (Drain to Source Voltage) curve during normal operation. When the VDS exceeds a threshold defined by the wafer probe/solder ball component specifications, the ID is then saturated. Biasing the gate voltage by the control block cell 240 makes the MOSFET a current limiter or regulator circuit. In addition, the MOSFET device may be designed to have a low RDSon (Drain to source on resistance) performance. This reduces the impact on the power distribution path 222, 226, both its resistance and its inductance in the linear region of operation.

The silicon interposer may be fabricated as a die on a wafer with the MOSFETs embedded and with the through silicon vias 250 on the backside of the die. The backside of the die will may then be attached to a multilayer substrate which provides the electrical connections for the system main board PCB 110. The front side of the die may be patterned and deposited to add redistribution layers to the top surface. These redistribution layers may be used to design feed lines to connect the current regulation MOSFETs and I/Os to the pads specific to the DUT. After the design and manufacturing of the interposer has been completed, manufacturing and assembly steps may be used to attach the wafer probe/solder balls to the interposer.

Figure 3:
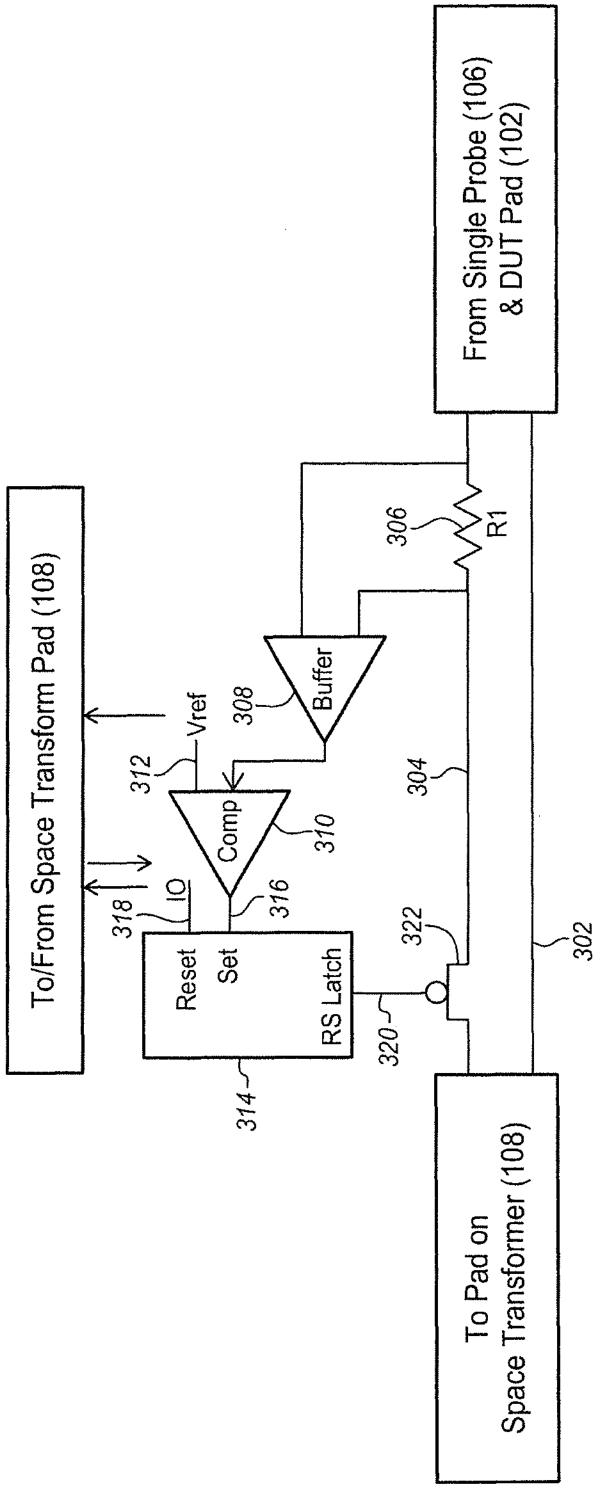
FIG. 3 is a circuit diagram of a current regulation circuit suitable for use in a current regulation interposer according to an embodiment of the invention.

FIG. 3 shows an alternative circuit design for current regulation in the interposer. This circuit is particularly useful for an implementation in which a single power MOSFET cannot be created to switch off in a region of operation suitable to the application voltage and current requirement. However, it may be used to provide greater or more precise control in other situations. Additional logic blocks are used to ensure that the circuit effectively regulates the current. The I/O signal 302 bypasses the circuit and is connected between the space transformer 108 and an appropriate probe 102. This may be done, in part, using TSVs. A power or ground line 304 is also coupled between the space transformer 108 and a probe pin 106. The power line is coupled to the current regulation circuitry that is controlled by the ATE tester through lines provided through the space transformer.

Circuit logic blocks are added to aid in the voltage reference settings which will control the VG (Gate Voltage) gate bias of the MOSFET. This in turn will turn the power MOSFET on or off. The current through the power line across a resistor is detected by a buffer 308. The output of the buffer is a voltage proportional to the sensed current and is applied to a comparator 310. The comparator compares the buffer voltage to a reference voltage 312 that can be designed internally to the interposer or may be provided by the ATE tester. A digital latch 314 with reset operation 318 controlled by the tester receives the comparator output 316 as a set signal.

When the buffer output indicates an overcurrent condition, this will be determined when the comparator determines that the buffer voltage exceeds the threshold of the reference voltage. The comparator will then send a high set signal 316 to the RS (reset) latch. The latch then sends a high signal at the latch 320 to the MOSFET device 322 on the power line breaking the power line. The power line is then isolated between the probe and the space transformer. As a result, the flow of current through the interposer 122 is stopped for that pin and the effects of the overcurrent are limited to the die, the pin and the interposer.

The latch signal may also be used to send a signal to the test program of the ATE, through, for example an I/O port 318 for error detection. The test program after correcting the cause of the overcurrent may then set the MOSFET back into the "on" state (for a normally on p-FET). Since these logic components are small in area compared to the large area needed for the power FET they can be considered negligible from a layout constraint standpoint. The additional inputs used in this example are the programmable reference voltage 312 to compare against the voltage drop over the resistor. In addition a reset line 318 is routed.

The cell block, the logic components, and the power MOSFETs can be repeated over the silicon interposer. To simplify the connections, cell to cell communication can be created like a clock tree network to allow fewer lines to be used for communication from the external hardware to each cell.

Figure 4:
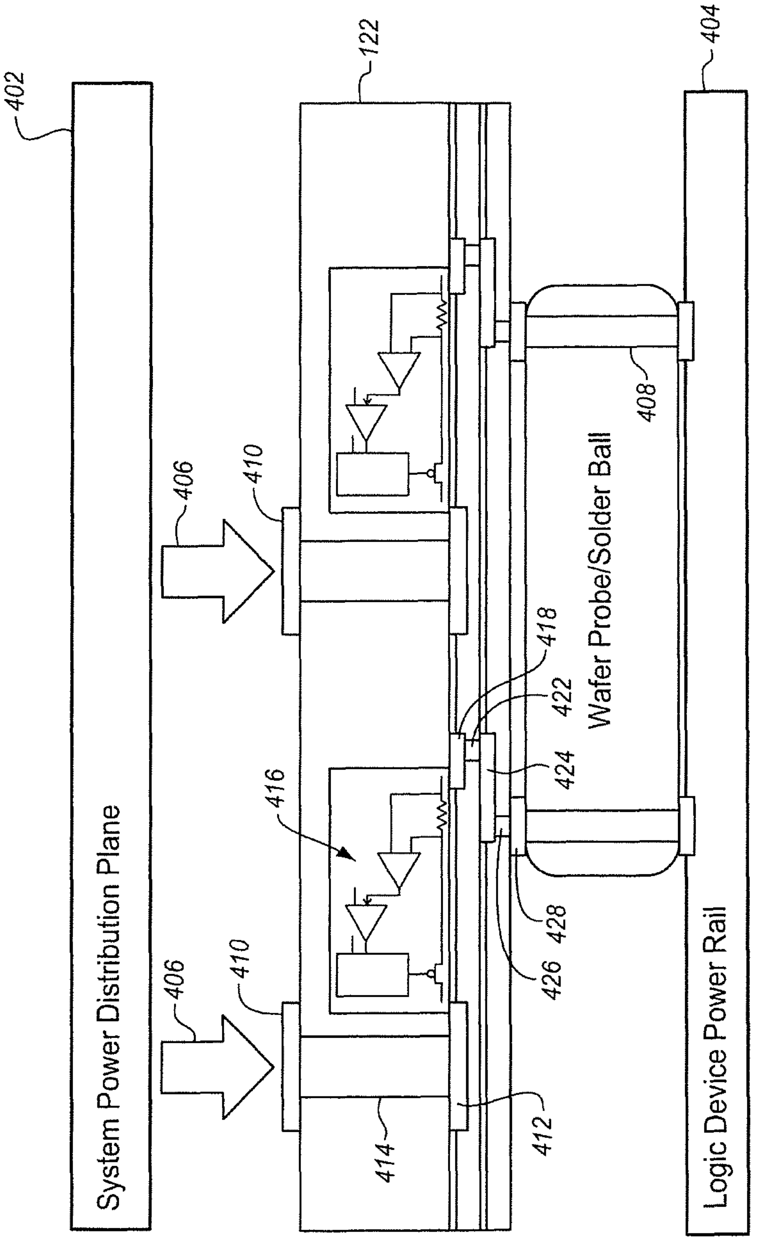
FIG. 4 is a cross-sectional diagram of a current regulation interposer according to an embodiment of the invention.

FIG. 4 is an alternative cross-sectional diagram of the current regulation interposer 122 described above. The interposer connects a power distribution plane 402 coupled through the space transformer 108 to a logic device power rail 404 of the DUT 102. Power lines 406 couple to pads 410 on the back side of the interposer 122. The power is carried through the interposer through vias 414 to a contact 412 at the desired horizontal layer, such as a metal layer, of the interposer. A current regulation circuit 416 is coupled to the power line through the horizontal layer to interrupt the connection when there is an overcurrent condition. The power line continues across to a second pad 418 at the same layer that couples the power into a second via 422 to another connection pad 424. The line is translated horizontally at the layer of this pad 424 to another via 426 and through the last via 426 to a final pad 428 on the interposer exterior.

The number of pads and vias may be adapted to suit any particular implementation to translate the position of the pads or to route signals efficiently through the interposer. In addition to translating the positions of the inputs and providing access to the current regulation circuit, in the illustrated example, the layers and vias perform another function. As can be seen the first via 414 coupled to the power distribution plane is very large. This physical size can allow it to carry a large current. The second 418 and third 426 vias, however, are much smaller. The conductive layers may be used to distribute power from the one large via 414 to many smaller vias 422. As shown the final connection pad 428 on the front side of the interposer connects to a probe. The system may use a single power connection pad 410 to distribute power to many probes 408. With the distribution and the overcurrent regulation both being performed in the interposer, the wiring may be simplified and still any overcurrent conditions can be limited to the particular probes involved. If the overcurrent circuits sensed current on multiple pins, then the overcurrent might be propagated from one probe to another through the shared connection. In addition, it might not be possible to identify precisely which probes are affected.

Figure 5:
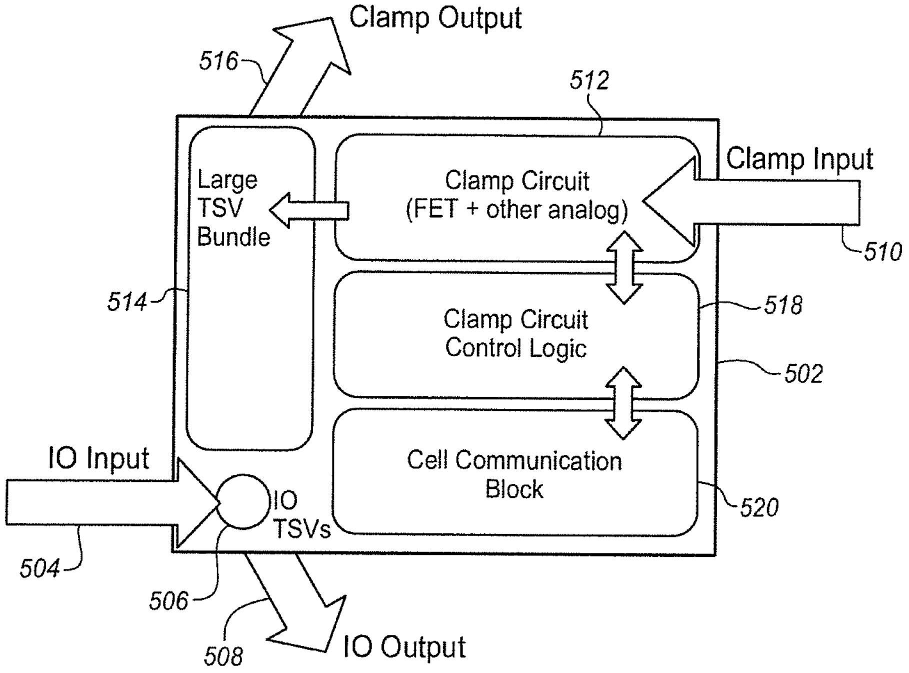
FIG. 5 is functional block diagram of a current regulation circuit and signal pathways suitable for use in a current regulation interposer according to an embodiment of the invention.

FIG. 5 is a cross-sectional diagram that may be applied to the interposer 122 shown in FIG. 4. The diagram is designed to show various features and functions that are in addition to those shown in FIG. 4 to aid in further understanding the examples described above. The interposer 502 as shown in this diagram has an I/O input 504 coupled to respective probes. The I/O inputs each are conducted through dedicated I/O TSVs 506 and are coupled through an I/O output through various intermediate devices to the ATE tester.

Similarly a clamp input 510 from a probe coupled to a power connection pad on the DUT is coupled through a clamp circuit 512 to a large TSV 514. The clamp circuit may use a current regulation circuit as described above or any other type of circuit to protect other components from overcurrent at the probe. The placement of the clamp circuit between the clamp input 510 and the large TSV 514, which may be shared with other probes, isolates the overcurrent condition to the affected clamp input. The clamp output is coupled to the power supply for the DUT which is typically the ATE tester.

The interposer also includes clamp circuit control logic 518 and control block cells 520. These devices may be duplicated for each probe or shared with a subset of the total number of probes. As described above the clamp circuit control logic may be used to set limits, thresholds and reference levels for the clamp circuit. The clamp circuit cuts the connection between the clamp input and output when the overcurrent condition is detected. The control block cell communicates with control interfaces from the detector to report conditions and reset the control logic based on commands from the tester. The clamp circuit control logic and the control block cells are optional components and may be implemented in any of a variety of different ways or not at all.

It is to be appreciated that a lesser or more equipped system than the examples described above may be preferred for certain implementations. Therefore, the configuration of the exemplary systems and circuits may vary from implementation to implementation depending upon numerous factors, such as price constraints, performance requirements, technological improvements, or other circumstances.

Embodiments may be implemented as any or a combination of: one or more microchips or integrated circuits interconnected using a motherboard, hardwired logic, software stored by a memory device and executed by a microprocessor, firmware, an application specific integrated circuit (ASIC), and/or a field programmable gate array (FPGA). The term "logic" may include, by way of example, software or hardware and/or combinations of software and hardware.

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to an apparatus comprising: a first connection pad to couple to automated test equipment; a second connection pad to couple to a device under test; and an overcurrent limit circuit to connect the first and second connection pads and to disconnect the first and second connection pads when the current between the first and second connection pads is over a predetermined amount.

Additional features include: the second connection pad is to connect a power supply to a probe to contact a connector of the device under test; the overcurrent limit circuit comprises a semiconductor switch to connect and disconnect the first and second connection pads in response to a sensed current; the switch is a transistor and the sensed current is applied to a gate of the transistor; the switch is a transistor, the apparatus further comprising a current sensor to compare the current to a threshold and to apply a switching voltage to a gate of the transistor if the sensed current exceeds the threshold; and a control interface to the automated test equipment to receive commands to reset the transistor and to control the threshold.

Additional features include: a multilayer silicon substrate to carry the first and second connection pads on opposite sides and the overcurrent limit circuit; a first through silicon via to connect the first connection pad to the overcurrent limit circuit and a second through silicon via to connect the overcurrent limit circuit to the second connection pad; a metal layer to translate the position of the second connection pad from the overcurrent limit circuit; a probe coupled to the second connection pad to contact an electrical contact point of the device under test; wherein the probe is directly connected to the second connection pad; and a plurality of overcurrent limit circuits coupled to the first connection pad and a plurality of second connection pads, each connected to an overcurrent limit circuit so that each overcurrent limit circuit isolates the respective second connection pad from the first connection pad in the event of an overcurrent at the respective second connection pad.

Other embodiments pertain to a multilayer silicon substrate comprising: a first connection pad to couple to automated test equipment; a second connection pad to couple to a device under test; a first via through the substrate to connect to the first connection pad; a second via through the substrate to connect to the second connection pad; metal layer within the substrate to connect the first and second vias; and an overcurrent limit circuit formed in the substrate to connect the first and second connection pads and to disconnect the first and second connection pads when the current between the first and second connection pads is over a predetermined amount.

Additional features may include: the second connection pad is to connect a power supply to a probe to contact a connector of the device under test; the overcurrent limit circuit comprises a semiconductor switch to connect and disconnect the first and second connection pads in response to a sensed current; and the switch is a transistor, the apparatus further comprising a current sensor to compare the current to a threshold and to apply a switching voltage to a gate of the transistor if the sensed current exceeds the threshold.

Other embodiments pertain to means for coupling a first connection pad to automated test equipment; means for coupling a second connection pad to a device under test; and means to connect the first and second connection pads and to disconnect the first and second connection pads when the current between the first and second connection pads is over a predetermined amount.

Additional features include: means to compare the current to a threshold and to apply a switching voltage to the means to connect and disconnect if the sensed current exceeds the threshold; means for resetting the means for connecting and disconnecting and means to control the threshold; and means to connect the first connection pad to a plurality of overcurrent limit circuits and means to connect each overcurrent limit circuit each to one of a plurality of second connection pads.

What is claimed is:

1. An apparatus comprising:

a substrate;

a first connection pad on a first side of the substrate having a connector pitch to couple to a space transformer of automated test equipment, the space transformer transforming a connector pitch from a connector pitch of a printed circuit board to the connector pitch of the first connection pad of the substrate;

a second connection pad on a second opposite side of the substrate to couple directly through probes to a device under test;

a first via within the substrate to carry power as current from the first connection pad;

a second plurality of vias within the substrate that are smaller than the first via to receive power from the first via and carry the received power to the second connection pad; and an overcurrent limit circuit between the first via and the second plurality of vias to electrically connect the first via to the second plurality of vias and to electrically disconnect the first via from the second plurality of vias when the current between the first and second plurality of vias is over a predetermined amount.

2. The apparatus of claim 1, wherein the second connection pad is to connect a power supply to a probe to contact a connector of the device under test.

3. The apparatus of claim 1, wherein the overcurrent limit circuit comprises a semiconductor switch formed within the substrate to connect and disconnect the first and second connection pads in response to a sensed current.

4. The apparatus of claim 3, wherein the switch is a power metal oxide semiconductor field effect transistor and the sensed current is applied to a gate of the transistor.

5. The apparatus of claim 1, wherein the substrate is a multilayer silicon substrate to carry the first and second connection pads on opposite sides and the overcurrent limit circuit within the multilayers.

6. The apparatus of claim 5, further comprising a third through silicon via to connect a data terminal of the first connection pad through a second overcurrent limit circuit and a third through silicon via to connect the second overcurrent limit circuit to a data terminal of the second connection pad.

7. The apparatus of claim 5, further comprising a metal layer between the second plurality of vias and the second connection pad to translate the positions of the second plurality of vias to the positions of the second connection pad.

8. The apparatus of claim 1, further comprising a probe coupled to the second connection pad to contact an electrical contact point of the device under test.

9. The apparatus of claim 8, wherein the probe is directly connected to the second connection pad.

10. The apparatus of claim 1, further comprising a plurality of overcurrent limit circuits coupled to the first connection pad and a plurality of second connection pads, each connected to an overcurrent limit circuit so that each overcurrent limit circuit isolates the respective second connection pad from the first connection pad in the event of an overcurrent at the respective second connection pad.

11. The apparatus of claim 1, wherein the overcurrent limit circuit comprises a buffer coupled to the current to produce a voltage representative of the current, a comparator coupled to the buffer to compare the voltage to a reference, a latch coupled to the comparator to generate a set signal in response to the comparator and a switch coupled to the current activated by the set signal to electrically connect and disconnect the first and second connection pads.

12. The apparatus of claim 11, further comprising a control interface coupled to the latch and to the automated test equipment to receive commands to reset the transistor and to control the threshold.

13. A multilayer silicon substrate comprising:

a first connection pad having a connector pitch on a first side of the substrate to couple to a space transformer of automated test equipment, the space transformer transforming a connector pitch of a printed circuit board to the connector Ditch of the first connection pad of the silicon substrate;

a second connection pad on a second side of the silicon substrate opposite the first side to couple directly through probes to a device under test;

a first through silicon via through the silicon substrate to connect to the first connection pad and to carry power as current from the first connection pad;

a second plurality of through silicon vias that are smaller than the first through silicon via through the silicon substrate to receive power from the first through silicon via and to carry the received power to the second connection pad;

a metal layer within the silicon substrate to connect the first and second vias; and an overcurrent limit circuit formed in the silicon substrate and coupled between the first through silicon via and the second through silicon via to alternately connect the first and second connection pads and to disconnect the first and second connection pads when the current between the first and second connection pads is over a predetermined amount.

14. The substrate of claim 13, wherein the second connection pad comprises a plurality of probes each coupled to a respective overcurrent limit circuit to connect a power supply to a probe, each probe to contact a connector of the device under test and wherein the plurality of probes are each connected to a single connection pad of the first connection pad to fan out the single first connection pad to multiple probes.

15. The substrate of claim 13, wherein the overcurrent limit circuit is formed on the silicon substrate including the current limiter as a semiconductor switch to connect and disconnect the first and second connection pads in response to a sensed current, the silicon substrate further comprising another layer formed on the silicon substrate over the overcurrent limit circuit having feed lines that are translated horizontally to connect the semiconductor switch to the second connection pad.

16. The substrate of claim 15, wherein the control block comprises a current sensor to compare the current to a threshold and to apply a switching voltage to the gate of the transistor if the sensed current exceeds the threshold.

17. An apparatus comprising:

means of a silicon substrate for coupling a first connection pad to a power supply signal through a space transformer of automated test equipment, the space transformer transforming a connector pitch of a printed circuit board to a connector pitch of the first connection pad of the silicon substrate;

means of the same silicon substrate for coupling a second connection pad directly through probes to a device under test;

a first via within and through the space transformer to carry power as current from the first coupling means;

a second plurality of vias within and through the space transformer that are smaller than the first via to receive power from the first via and carry the received power to the second coupling means; and means of the same silicon substrate for connecting the first via and the second plurality of vias and for disconnecting the first via and the second plurality of vias when the current between the first and second plurality of vias is over a predetermined amount.

18. The apparatus of claim 17, further comprising means to compare the current to a threshold and to apply a switching voltage to the transistor, the means to compare the current to connect and disconnect the power supply signal if the current exceeds the threshold.

19. The apparatus of claim 18, further comprising means coupled to the automated test equipment for resetting the means for connecting and disconnecting and the means to control the threshold.

20. The apparatus of claim 17, further comprising means to connect a single power supply signal from the first connection pad to a plurality of overcurrent limit circuits and means to connect each overcurrent limit circuit each to one of a plurality of second connection pads.

* * * * *